(12) United States Patent
Awad et al.

(10) Patent No.: US 10,121,555 B2
(45) Date of Patent: Nov. 6, 2018

(54) WEAR-LIMITING NON-VOLATILE MEMORY

(71) Applicant: Advanced Micro Devices, Inc., Sunnyvale, CA (US)

(72) Inventors: Amro Awad, Raleigh, NC (US); Sergey Blagodurov, Bellevue, WA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 86 days.

(21) Appl. No.: 15/267,092

(22) Filed: Sep. 15, 2016

(65) Prior Publication Data

US 2017/0345512 A1    Nov. 30, 2017

Related U.S. Application Data

(60) Provisional application No. 62/342,183, filed on May 26, 2016.

(51) Int. Cl.
*G06F 12/00* (2006.01)
*G06F 13/00* (2006.01)
(Continued)

(52) U.S. Cl.
CPC ........ *G11C 16/3495* (2013.01); *G06F 3/0616* (2013.01); *G06F 3/0629* (2013.01);
(Continued)

(58) Field of Classification Search
CPC .......................... G06F 12/00–12/0292; G06F 2003/0691–2003/0698;
(Continued)

(56) References Cited

U.S. PATENT DOCUMENTS 6,076,161 A * 6/2000 Ho .................. G06F 9/321
712/E9.035
6,532,529 B1 * 3/2003 Hongo .............. G06F 12/0638
711/103
(Continued)

OTHER PUBLICATIONS

Definition of wear leveling; Margaret Rouse; Jan. 2012; retrieved from http://searchstorage.techtarget.com/definition/wear-leveling on Feb. 6, 2018 (2 pages) (Year: 2012).*

(Continued)

*Primary Examiner* — Daniel C Chappell
(74) *Attorney, Agent, or Firm* — Volpe and Koenig, P.C.

(57) ABSTRACT

A non-volatile memory device having at least one non-volatile flash memory formatted with physical addresses to read and write data that is organized into blocks of data, wherein the blocks of data are organized into pages of data, and wherein the pages of data are organized into cells of data. The non-volatile memory device includes a non-volatile memory controller to direct read and write requests to the non-volatile flash memory for the storage and retrieval of data. The non-volatile memory controller includes a flash translation layer to correlate read and write requests for data having a logical address between the reading and writing the data to physical address location of the non-volatile flash memory. The flash translation layer, when writing to a physical address location, chooses between a wear-leveling circuit and a wear-limiting circuit to select the physical address location.

15 Claims, 6 Drawing Sheets

(51) Int. Cl.
*G06F 13/28* (2006.01)
*G11C 16/34* (2006.01)
*G11C 16/10* (2006.01)
*G11C 16/26* (2006.01)
*G06F 3/06* (2006.01)

(52) U.S. Cl.
CPC ............ *G06F 3/0688* (2013.01); *G11C 16/10* (2013.01); *G11C 16/26* (2013.01)

(58) Field of Classification Search
CPC ........... G06F 2212/00–2212/7211; G06F 3/00; G06F 3/06–3/0616; G06F 3/0617–3/0629; G06F 3/0631–3/0688; G06F 3/0689; G11C 2207/00–2207/229; G11C 2211/00–2211/565; G11C 7/00–7/24; G11C 8/00–8/20; G11C 16/06–16/10; G11C 16/102–16/26; G11C 16/28–16/3495

See application file for complete search history.

(56) References Cited

U.S. PATENT DOCUMENTS

| | | | | |
|---|---|---|---|---|
| 9,099,182 | B1* | 8/2015 | Montierth | G11C 16/10 |
| 2002/0199054 | A1* | 12/2002 | Akahane | G11C 16/102 711/103 |
| 2004/0083335 | A1* | 4/2004 | Gonzalez | G06F 12/0246 711/103 |
| 2007/0061504 | A1* | 3/2007 | Lee | G11C 16/102 711/103 |
| 2008/0098193 | A1* | 4/2008 | Im | G06F 12/0246 711/170 |
| 2008/0198651 | A1* | 8/2008 | Kim | G06F 12/0246 365/185.03 |
| 2008/0235432 | A1* | 9/2008 | Chen | G06F 12/0246 711/100 |
| 2008/0320214 | A1* | 12/2008 | Ma | G06F 3/0613 711/103 |
| 2009/0083478 | A1* | 3/2009 | Kunimatsu | G06F 12/0246 711/103 |
| 2009/0172255 | A1* | 7/2009 | Yeh | G06F 12/0246 711/103 |
| 2009/0198874 | A1* | 8/2009 | Tzeng | G06F 12/0246 711/103 |
| 2010/0095084 | A1* | 4/2010 | Manning | G06F 12/0246 711/206 |
| 2010/0146194 | A1* | 6/2010 | Cheng | G06F 12/0246 711/103 |

OTHER PUBLICATIONS

Mellow Writes: Extending Lifetime in Resistive Memories through Selective Slow Write Backs; Zhang, et al.; 2016 ACM/IEEE 43rd Annual International Symposium on Computer Architecture; Jun. 16-22, 2016; pp. 519-531 (Year: 2016).*
Algorithms and data structures for flash memories; Gal et al.; ACM Computing Surveys, vol. 37, iss. 2; Jun. 2005; pp. 138-163 Year: 2005).*
High-endurance hybrid cache design in CMP architecture with cache partitioning and access-aware policy; Syu et al.; Proceedings of the 23rd ACM international conference on Great lakes symposium on VLSI; May 2-3, 2013; pp. 19-24 (Year: 2013).*
Awad A. et al., "Write-Aware Management for Fast NVM-based Memory Extensions", Proceedings of the 2016 International Conference on Supercomputing, Jun. 1-3, 2016, 13 pgs., Article No. 9, ACM, Istanbul, Turkey.
Hornung, R. D. et al., Hydrodynamics Challenge Problem, Lawrence Livermore National Laboratory, Technical Report, LLNL-TR-490254, Jul. 5, 2011, 28 pages, USA.

Huai, Y. et al., "Observation of Spin-Transfer Switching in Deep Submicron-Sized and Low-Resistance Magnetic Tunnel Junctions", Applied Physics Letters 84.16, 2004, pp. 3118-3120, USA.
Li, Z. et al., "Exploring High-Performance and Energy Proportional Interface for Phase Change Memory Systems", Proceedings of the 2013 IEEE 19th International Symposium on High Performance Computer Architecture, Feb. 23-27, 2013, pp. 210-221, IEEE Computer Society, Shenzhen, China.
Awad, A. et al., "Non-Volatile Memory Host Controller Interface Performance Analysis in High-Performance I/O Systems", Proceedings of the IEEE International Symposium on Performance Analysis of Systems and Software, Mar. 29-31, 2015, pp. 145-154, IEEE, Philadelphia, PA, USA.
Lee, B. et al., "Architecting Phase Change Memory as a Scalable DRAM Alternative", Proceedings of the 36th International Symposium on Computer Architecture, Jun. 20-24, 2009, pp. 2-13, ACM, Austin, TX, USA.
Qureshi, M. et al., "Enhancing Lifetime and Security of PCM-Based Main Memory with Start-Gap Wear Leveling", Proceedings of the 42nd Annual IEEE/ACM International Symposium on Microarchitecture, Dec. 12-16, 2009, pp. 14-23, ACM, New York, NY, USA.
Qureshi, M. et al., "Scalable High Performance Main Memory System Using Phase-Change Memory Technology", Proceedings of the 36th International Symposium on Computer Architecture, Jun. 20-24, 2009, pp. 24-33, ACM, Austin, TX, USA.
Ramos, L. et al., "Page Placement in Hybrid Memory Systems", Proceedings of the International Conference on Supercomputing, May 31-Jun. 4, 2011, pp. 85-95, ACM, Tuscon, AZ, USA.
Saxena, M. et al., "FlashVM: Virtual Memory Management on Flash", Proceedings of the 2010 USENIX Conference on USENIX Annual Technical Conference, Jun. 23-25, 2010, 14 pgs., USENIX, Boston, MA, USA.
Van Essen, B. et al., "On the Role of NVRAM in Data-Intensive Architectures: An Evaluation", Proceedings of the 2012 IEEE 26th International Parallel and Distributed Processing Symposium, May 21-25, 2012, pp. 703-714, IEEE Computer Society, Shanghai, CN.
Van Essen, B. et al., "DI-MMAP—A Scalable Memory-Map Runtime for Out-of-Core Data-Intensive Applications", Cluster Computing, 2013, pp. 15-28, vol. 18, Issue 1, Springer, USA.
Vucinic, D. et al., "DC Express: Shortest Latency Protocol for Reading Phase Change Memory over PCI Express", Proceedings of the 12th USENIX Conference on File and Storage Technologies, Feb. 17-20, 2014, pp. 309-315, USENIX, Santa Clara, CA, USA.
Yang, B. et al., "A Low Power Phase-Change Random Access Memory using a Data-Comparison Write Scheme", Proceedings of the IEEE International Symposium on Circuits and Systems, May 27-30, 2007, pp. 3014-3017, IEEE, New Orleans, LA, USA.
Yang, J. et al., "Memristive Devices for Computing", Nature Nanotechnology, Jan. 2013, pp. 13-24, vol. 8, Issue 1, Macmillan Publishers Limited, USA.
Yang, J. et al., "Frequent Value Compression in Data Caches", Proceedings of the 33rd Annual ACM/IEEE International Symposium on Microarchitecture, Dec. 10-13, 2000, pp. 258-265, ACM, Monterey, CA, USA.
Young, V. et al., "DEUCE: Write-Efficient Encryption for Non-Volatile Memories", Proceedings of the 20th International Conference on Architectural Support for Programming Languages and Operating Systems, Mar. 14-18, 2015, pp. 33-44, ACM, Istanbul, Turkey.
Zhang, Y. et al., "A Study of Application Performance with Non-Volatile Main Memory", Proceedings of the 31st Symposium on Mass Storage Systems and Technologies, May 30-Jun. 5, 2015, pp. 1-10, Santa Clara, CA, USA.
Zhou, P. et al., "A Durable and Energy Efficient Main Memory Using Phase Change Memory Technology", Proceedings of the 36th International Symposium on Computer Architecture, Jun. 20-24, 2009, pp. 14-23, ACM, Austin, TX, USA.
Intel Corporation, "Intel and Micron Produce Breakthrough Memory Technology" Jul. 23, 2015 (available at: https://web.archive.org/web/20150730220640/http://newsroom.intel.com/docs/DOC-6713).

(56) References Cited

OTHER PUBLICATIONS

Intel Corporation, "NVM Express" Feb. 16, 2012, 126 pgs., Revision 1.0c, USA.
NVM Library Team, Intel Corporation, "Persistent Memory Programming", Mar. 25, 2015 (available at: http://pmem.io/).

* cited by examiner

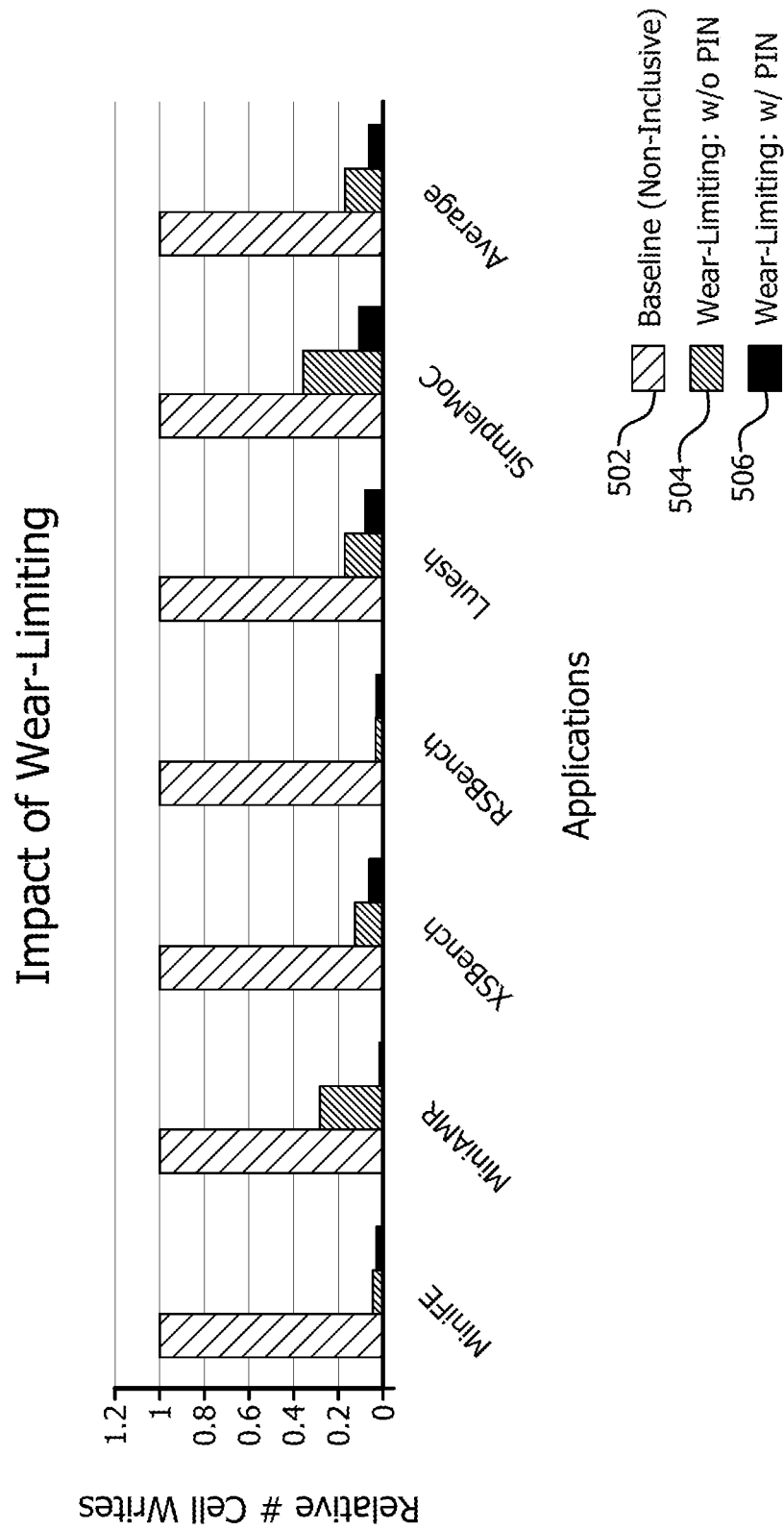

WEAR-LIMITING NON-VOLATILE MEMORY

CROSS-REFERENCE(S) TO RELATED APPLICATION(S)

This application claims the benefit of U.S. Provisional Application Ser. No. 62/342,183, filed on May 26, 2016, which is incorporated herein by reference.

BACKGROUND

Non-Volatile Memories (NVMs) are considered as a promising replacement for the slower NAND-based flash drives. Such replacement can enable very fast swap devices that normally extend the main memory. However, current NVM devices have a limited number of writes before wearing out, and hence an extensive use of such technologies requires awareness of the number of writes to such devices. To improve the life cycle of such NVM devices, writes of data to the NVM are distributed using a wear-leveling NVM controller that attempts to evenly distribute the writes across the memory. While improving the life cycle of the NVM by attempting to evenly distribute the writes across the memory, the wear-leveling NVM controller often has the unintended consequence of increasing the number of writes to the NVM. Thus, a need exists for a NVM controller that will reduce the number of writes.

BRIEF DESCRIPTION OF THE DRAWINGS

A more detailed understanding may be had from the following description, given by way of example in conjunction with the accompanying drawings wherein:

FIG. 5 is a graph of bench mark applications showing the beneficial wear reduction results from wear-limiting circuitry.

DETAILED DESCRIPTION

The advent of NVMs represent a broad range of NAND flash memory architectures that are presently most well-known as the underlying memory found in solid state drives (SSDs), where NAND stands for the logical Boolean operator (Not-AND) and represents the operation of the logical gate used to store data. Presently NAND flash memory is preferred over other logical gates for their energy efficiency and dense manufacturing techniques. Presently, SSDs and other solid state storage devices include NAND flash memory manufactured on a planar chip. However, a new class of flash memory has been introduced using vertically integrated layers of planar chips that present a three-dimensional architecture. The three-dimensional architecture is available as a stack of vertical flash memory, while other proprietary three-dimensional architectures have been developed. Such vertically integrated flash memory represents an improvement over planar NAND flash memory and presents a competitive alternative to Dynamic Random Access Memory (DRAM). Additionally, it is "persistent memory", which means it retains data stored on NVM when the power is switched off, unlike DRAM. It will be appreciated that NVM can include any other known or future types of non-volatile memory technology, or any combination thereof. Advantageously, the present disclosure describes NVM having wear-limiting features to extend the life cycle of the NVM.

The present disclosure is applicable to non-volatile memory, and in particular, to wear-limiting non-volatile memory such as a non-volatile memory device having at least one non-volatile flash memory formatted with physical addresses to read and write data that is organized into blocks of data, wherein the blocks of data are organized into pages of data, and wherein the pages of data are organized into cells of data. The non-volatile memory device further includes a non-volatile memory controller to direct read and write requests to the non-volatile flash memory for the storage and retrieval of data. The non-volatile memory includes a flash translation layer to correlate read and write requests for data having a logical address between the reading and writing of the data to a physical address location of the non-volatile flash memory. The flash translation layer when writing to a physical address location includes a wear-leveling circuit to select the physical address location and includes a wear-limiting circuit to select the physical address location. Upon the non-volatile memory controller detecting a flag related to a write request, the flash translation layer selects the wear-limiting circuit rather than the wear-leveling circuit to select the physical address location.

Figure 1:
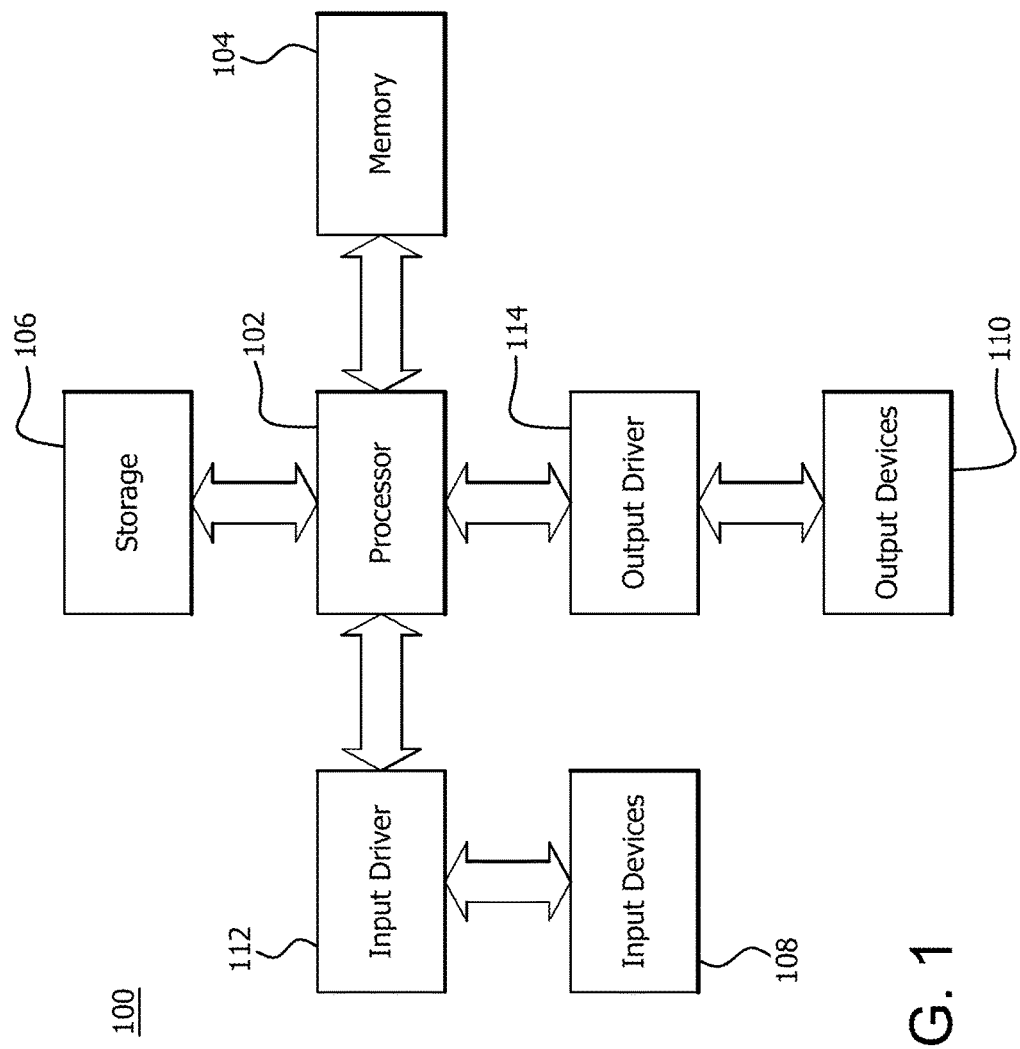
FIG. 1 is a block diagram of an example device in which one or more disclosed inventive features may be implemented.

FIG. 1 is a block diagram of a computing device 100 in which one or more disclosed NVMs can be implemented. The device 100 can include, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 can also optionally include an input driver 112 and an output driver 114. It is understood that the device 100 can include additional components not shown in FIG. 1.

The processor 102 can include a central processing unit (CPU), a graphics processing unit (GPU), a CPU and GPU located on the same die, or one or more processor cores, wherein each processor core can be a CPU or a GPU. The memory 104 can be located on the same die as the processor 102, or can be located separately from the processor 102. The memory 104 can include a volatile or non-volatile memory, for example, NVM, random access memory (RAM), dynamic RAM, or a cache.

The storage 106 can include a fixed or removable storage, for example, a hard disk drive, a solid-state drive, an optical disk, or a flash drive, where the solid state drive and flash drive include NVM. The input devices 108 can include a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 can include a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present.

Advantageously, the memory 104 and/or the storage 106 can include NVM.

Figure 2:
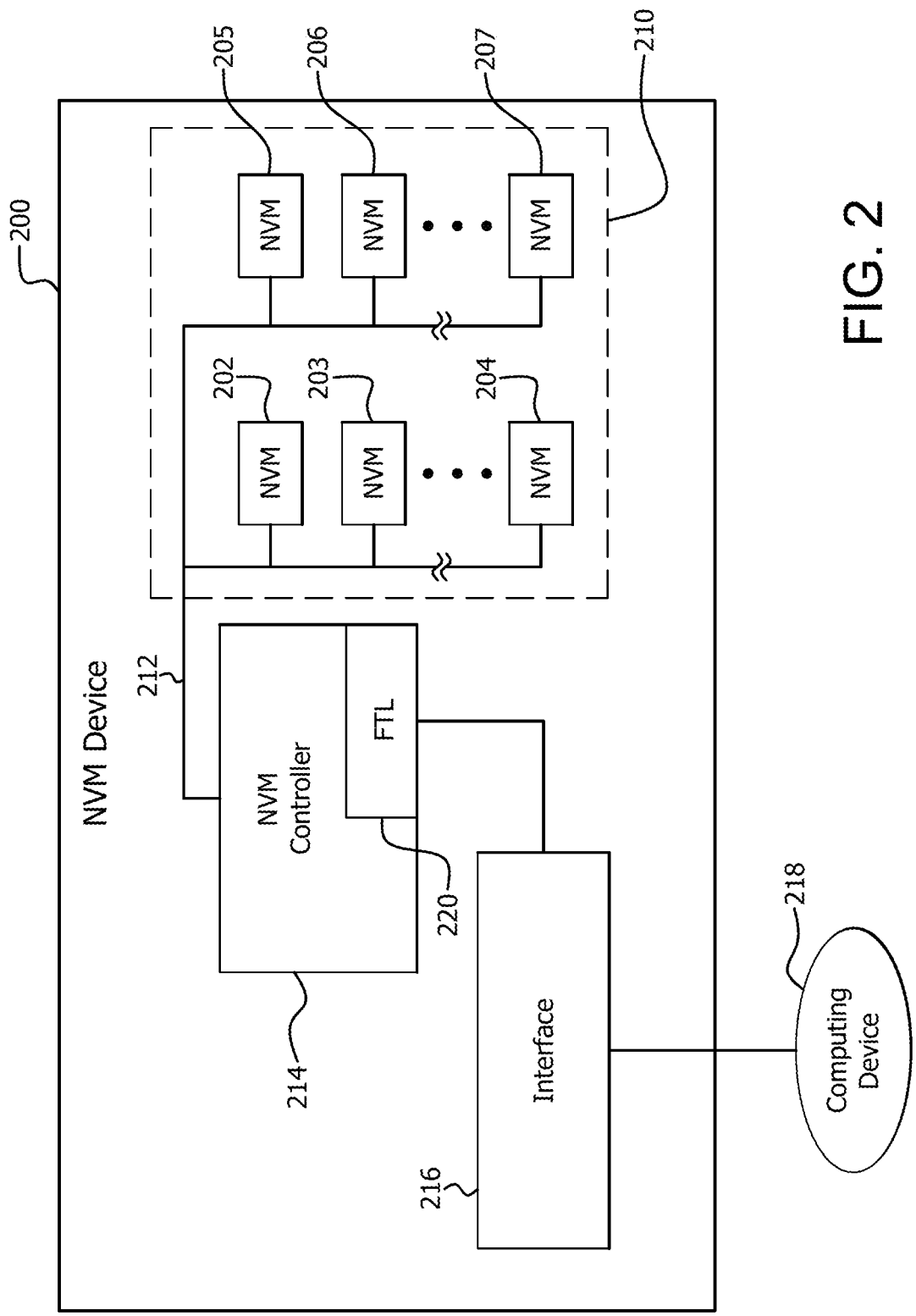
FIG. 2 is a block diagram of an example NVM device.

With reference to FIG. 2, a NVM device 200 includes NVMs 202-207 connected in an array 210 via a bus 212 to an NVM controller 214 that in turn receives read and write commands via an interface 216 to the computing device 218. NVM can also be represented as a single memory. Each NVM 202-207 is organized into "blocks" that are each erasable at once, and the blocks are further organized into "pages" that are each writeable and readable at once. Finally, pages are further organized into "cells" as small as 64 Bytes. NVM incorporating three-dimensional flash memory architectures have cells that each can be writeable and readable at once. NVM can include multiple integrated circuits, where each integrated circuit can have multiple blocks. The blocks from corresponding integrated circuits (e.g., blocks having the same position or block number) can form "super blocks." Each memory location (e.g., page or block) of NVM can be addressed using a physical address (e.g., a physical page address or physical block address).

The interface 216 provides for communication with the hardware and the operating system of the computing device 218. The interface 216 is configured to interact with the hardware and operating system of the computing device 218 using various types of conventional interfaces depending upon the system configuration of the computing device and whether the NVM device is to be used for memory or storage. While any type of suitable interface configuration can be used, interfaces can include, but are not limited to, conventional Peripheral Component Interconnect Express (PCIe), NVM express, which is a modified variation of PCIe for NVM and DRAM interfaces such as SDRAM for use in a dual in-line memory module (DIMM) as well as Rambus DRAM. One of ordinary skill in the art will appreciate from the variety of interface configurations described above that depending upon the interface configuration used, the interface 216 conventionally interacts with the hardware and the operating system of the computing device 218 in accordance with the known protocols and procedures of the interface configuration type used. The interface 216 receives read and write requests in the format of the interface configuration used that are then formatted and passed to a submission queue within the NVM controller 214.

It should be noted that the interface 216 and NVM controller 214 have been described above for purposes of facilitating understanding of the operation and functions. The interface 216 and the NVM controller 214 are each capable of being represented as hardware, software or firmware. The functions described and attributed to each are capable of being combined into the same hardware or broken out into other hardware/software/firmware configurations such that each function can be represented as a separate component. Furthermore, the interface 216 can be included outside of the NVM device 200 as a standalone circuit or combined within other components of the computing device. All of these configurations are possible without detracting from the present invention.

Figure 2A:
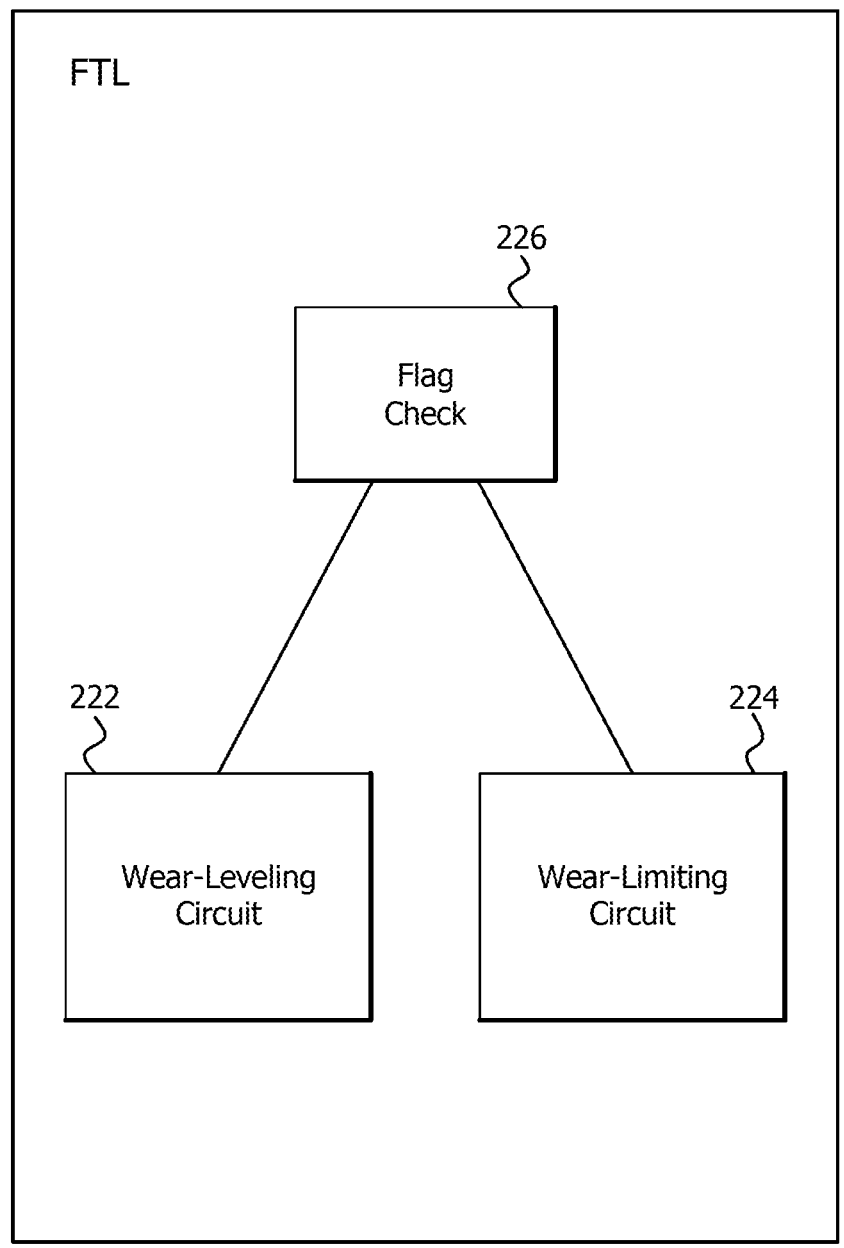
FIG. 2A is a block diagram of an Flash Translation Layer (FTL) device.

The NVM controller 214 handles bus control between the various NVMs 202-207 as well as block and page control for each NVM 202-207. NVM controller 214 includes a Flash Translation Layer (FTL) 220 that includes a wear-leveling circuit 222 (FIG. 2A) to manage the wear-leveling and writing of the blocks to NVM physical pages each time it is written. A table inside the FTL 220 maintains the logical to physical addresses of each NVM 202-207. Note that the operating system deals with the device logical addresses and the FTL 220 inside the NVM controller 214 handles the translation to the physical page addresses on each NVM 202-207.

The FTL 220 advantageously includes a wear-limiting circuit 224 (FIG. 2A) that compares the old values of the NVM cells with the new data to be written, and then eliminates programming those cells which don't have their values changed. The wear-limiting circuit 224 is efficient due to the fact that the probability of having the bit written to a cell being similar to the old value is 50%, hence a promising write reduction. Unfortunately, combining both wear-limiting and wear-leveling is counter-intuitively tricky. NVM devices are expected to deploy wear-leveling techniques that try to distribute the page writes uniformly across the device pages. In contrast, however, wear-limiting is most efficient when the pages get written to the exact physical pages. In other words, if the NVM controller 214 deploys a wear-leveling mechanism, it will not know if the current page write has any logical relationship with any free physical page (i.e., subsequent writes to the logical device address can be from different applications and runs, and hence the data being written can be significantly different). The FTL 220 finds a free page depending on the wear-leveling algorithm and writes the page there. Once the write is complete, the translation layer 220 logs the new NVM device physical address for that logical address. NVM devices when used in a DIMM type interface configuration for use as memory can include a wear-leveling circuit.

To handle the problem of whether to use wear-limiting or wear leveling, a flag check circuit 226 is provided by the computing device 218 as denoted by a PIN flag to determine when to implement the wear-limiting circuit rather than the wear-leveling circuit. As will be described in greater detail hereinafter, the PIN flag is provided to the NVM controller when writing a page.

Figure 3A:
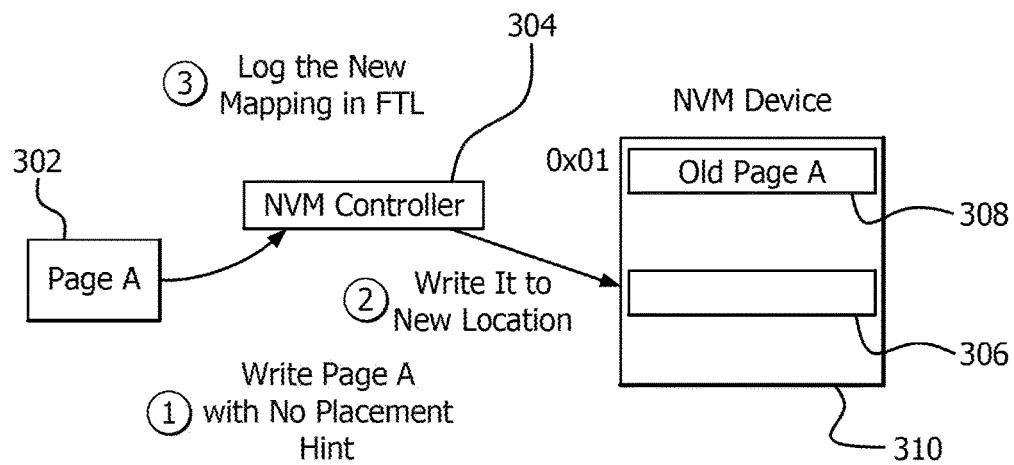
FIG. 3A is a block diagram of a NVM write using a wear-leveling circuit.
Figure 3B:
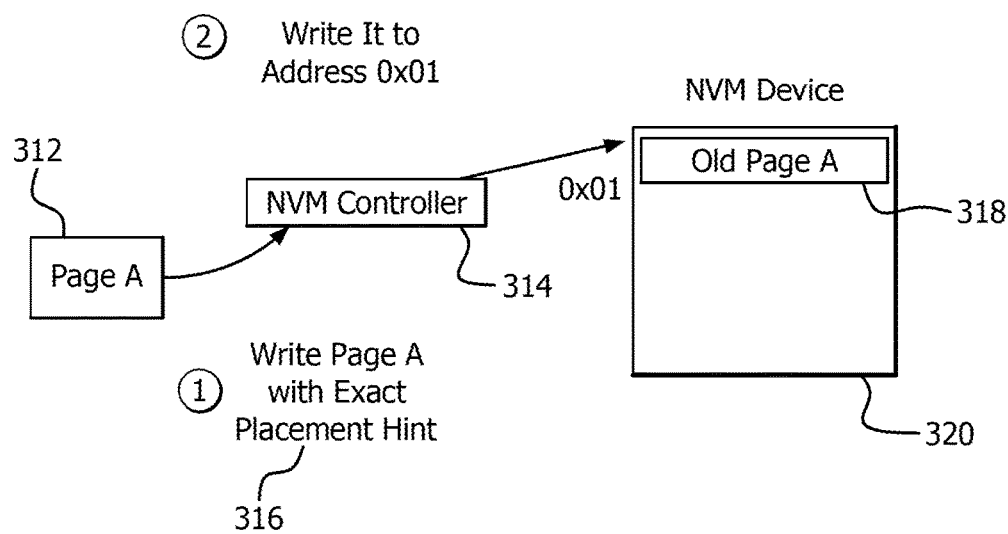
FIG. 3B is a block diagram of a NVM write using a wear-limiting circuit.

With reference to FIGS. 3A and 3B, FIG. 3A illustrates an implementation of the wear-leveling circuit, where a page write request 302 to the NVM controller 304 results in the page being written at a new page address 306 rather than the old address 308 with the NVM 310. Alternatively, FIG. 3B illustrates an implementation of the wear-limiting circuit where a page write request 312 to the NVM controller 314 having a PIN flag 316 results in the page being written at the old page address 318 within the NVM 320. For example, the PIN flag can use one of the reserved fields of a protocol command structure for one of the conventional interfaces discussed above to provide a "hint" to the NVM controller 314 to place the logical page to its previous mapping in the translation table. Otherwise, the NVM controller 314 will simply deploy its default wear-leveling circuit. In the case of NVM using a DIMM type interface configuration, the hint could be as simple as writing to a memory mapped register that is visible to the NVM controller 314, and hence avoids applying wear-leveling techniques when starting to write the physical page to NVM. To appreciate the impact of wear-leveling on wear-limiting effectiveness, it is understood that the wear-leveling technique will pick a physical location that has no logical relationship with the actual value of the page to be written, thus avoiding any application of wear-limiting.

The PIN flag can be generated either by the hardware, the operating system of the computing device 218, or both. Before writing the page/block to the NVM 202-207, the NVM controller 214 checks if the page that is currently being swapped out has ever been swapped out before for the same process. If so, the guidance to the NVM device controller 214 is provided to write it to the exact previous address and bypass the wear-leveling algorithm that is implemented by FTL layer, as shown in FIG. 3B. It will be understood that a read-compare-write implementation of the wear-limiting circuit can be used inside the NVM devices, and hence writing the same page to its previous location should only change the cells that had their values changed.

Conventional interface protocols such as NVM Express send a command to the submission queue that will be later processed by the NVM controller 214. Such a command has different fields and some of them are unused. For example, an unused field can be used to pass the PIN flag about the write command and the NVM controller should be implemented in such a way that understands these hints and enforce placing the page on its previous physical address rather than moving it around.

The PIN flags can be implemented in several ways:

The system software, such as the operating system, device driver or middleware, can designate a page for wear-limiting, but can also decide that a page has been swapped out a significant amount of times recently and hence it can no longer force exact placement to avoid writing the same cells repeatedly and hence reduce the writes uniformity across the NVM device blocks. A number of times swapped out value could be maintained per page and used to guide the NVM controller 214. For example, the NVM controller 214 can use the default wear-leveling technique when the number of swap outs exceeds a pre-defined swap threshold.

The PIN flag can be generated by a memory management unit (MMU) within the computing device 218. A conventional MMU keeps track of the number of writes per page and this number of writes can be compared with a threshold value to determine if the page has been significantly written to, and hence writing it back to the same exact physical address is undesirable. Alternatively, it can have been slightly written and hence the NVM controller 214 can swap out the page to the exact previous address.

The thresholds that are set can be specified via BIOS settings, hardware counters, within the NVM controller 214 or /sys or /proc interface within the computing device 218, where the "/sys or /proc interface" refers to pseudo-filesystems used as an interface to kernel data structures.

Figure 4:
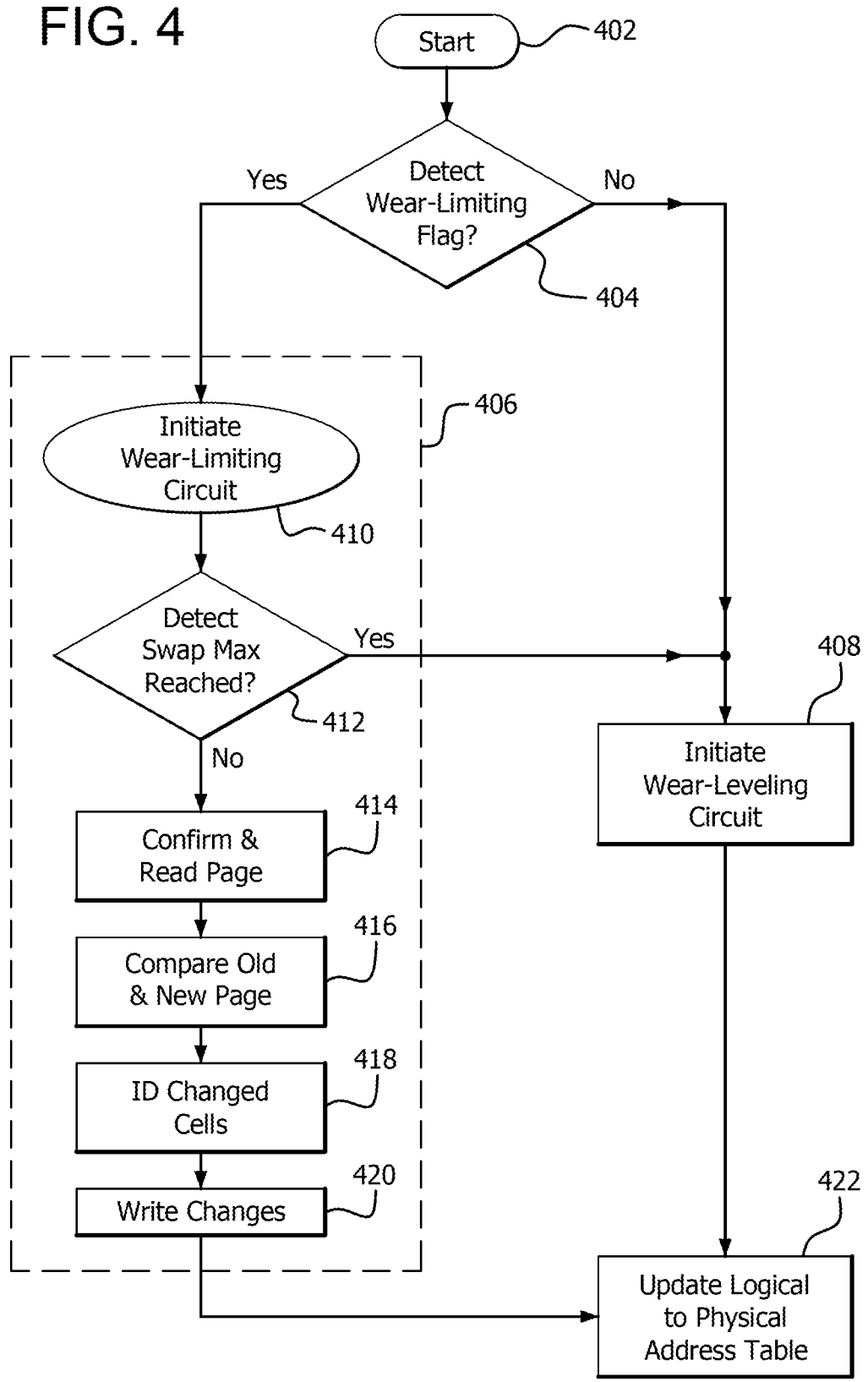
FIG. 4 is a flow diagram of an FTL implementing a wear-leveling circuit with a wear-limiting circuit.

With reference to FIG. 4, a method for managing wear-limiting and wear-leveling circuits within the FTL 220 is shown. Upon receiving a write request in the submission queue at 402 from the computing device, the FTL 220 will first check for a PIN flag to determine whether wear-limiting or wear-leveling should be used. At 404, if the flag is active the FTL 220 initiates the wear-limiting circuit at 406, otherwise the wear-leveling circuit is initiated at 408. The wear-limiting circuit initiates at 410 and first checks whether a swap threshold limit has been reached for writing to the same page physical address at 412. If the limit has been reached, the wear-limiting circuit exits and initiates the wear-leveling circuit; otherwise, the wear-limiting circuit confirms the physical address for the old page and reads the old page data from the NVM 414. The old page data and new page data is compared at 416 and cells within the page of data containing changes are identified at 418. Then only the cells identified with changes made to the page are written to the old page address at 420. Upon completion of the wear-limiting circuit the FTL updates the logical to physical address table to note the changes made at 422. The NVM controller then exits and moves on to the next task in the submission queue.

Thus, for flash memory that swaps pages in a write operation, it can be understood that a page can be evicted several times for the same run and it is likely that a few bits will change from the previous value. Various wear-limiting methods like read-compare-write, for example, differential writes, have been shown to provide a significant savings by exploiting such natural data similarity across subsequent write/eviction to the same page. While wear-leveling can be effective at distributing writes uniformly, it can exacerbate the actual number of cell writes; evictions for the same page will be written to new physical locations and hence unrelated previous values of cells.

With reference to FIG. 5, bench mark applications with known memory writing values are shown with the wear from a baseline 502, wear-limiting without a PIN flag 504 and wear-limiting with a PIN flag 506. The baseline 502 refers to a memory management system where memory writes are made without any consideration of the logical to physical address table to reduce wear. It can be understood that a significant reduction in the wear of the NVM is obtained using the techniques set forth herein.

Thus, the system and method for wear-limiting and wear-leveling in non-volatile memory device includes at least one non-volatile flash memory formatted with physical addresses to read and write data that is organized into at least a first unit of data and a second unit of data, wherein the second unit of data is a subset of the first unit of data. A non-volatile memory controller is included to direct read and write requests to the non-volatile flash memory for the storage and retrieval of data. The non-volatile memory includes a flash translation layer to correlate read and write requests for data having a logical address between the reading and writing of the data to a physical address location of the non-volatile flash memory. The flash translation layer for writing to the physical address location includes a wear-leveling circuit to select the physical address location and a wear-limiting circuit to select the physical address location. Such that upon the non-volatile memory receiving a write request, the flash translation layer chooses between the wear-limiting circuit and the wear-leveling circuit to select the physical address location.

It will be further appreciated that non-volatile memory device has the first unit of data as a block of data and the second unit of data as a cell of data, where the cell of data is a subset of a page of data and the page of data is a subset of the block of data. The flash translation layer for writing to a physical address location includes a flag check circuit, such that, the non-volatile memory controller, upon detecting a flag related to the write request, causes the flash translation layer to select the wear-limiting circuit rather than the wear-leveling circuit to select the physical address location.

When the flash translation layer receives a write request for writing a page of data to memory using the wear-leveling circuit, the wear-leveling circuit determines a physical address for a least used page in the memory and causes the page to be written to the physical address for the least used page. Alternately, when the flash translation layer receives a write request having a flag for writing a page of data to memory using the wear-limiting circuit, the wear-limiting circuit determines a physical address where the page of data was last stored in the memory and determines cells of data that have changed and causes the cells of data that have changed to be written to the physical address where the page of data was last stored in the memory.

It will be appreciated, that FIG. 2, as well as later figures and various disclosed embodiments, can sometimes be described in terms of using flash technology. However, this is not intended to be limiting, and any other type of non-volatile memory affected by wear can be implemented instead.

It should be understood that many variations are possible based on the disclosure herein. Although features and elements are described above in particular combinations, each feature or element can be used alone without the other features and elements or in various combinations with or without other features and elements.

The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor, which implements aspects of the inventive features.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A memory device, comprising:
   at least one non-volatile memory configured to read and write data; and
   a controller including a first circuit and a second circuit, the controller being configured to:
   receive a write request,
   select one of the first circuit and the second circuit and initiate the selected one of the first circuit and the second circuit to complete the request,
   wherein, when the first circuit is initiated, the first circuit is configured to determine a physical address for a least used page in the non-volatile memory and cause data associated with the write request to be written to the least used page, and
   wherein, when the second circuit is initiated, the second circuit is configured to determine a physical address for a page in the non-volatile memory where the data associated with the write request was last stored, identify cells of the data that have changed, and cause only those cells of the data that have changed to be written to the page where the data was last stored, wherein any data that is stored in the non-volatile memory is organized into pages, each page including a plurality of cells, wherein the first circuit includes a wear-leveling circuit and the second circuit includes a wear-limiting circuit.

2. The memory device of claim 1, wherein the controller is further configured to:
   identify a value of a flag associated with the write request;
   select the first circuit to complete the write request when the flag has a first value; and
   select the second circuit to complete the write request when the flag has a second value.

3. The memory device of claim 1, where the first circuit and the second circuit are part of a flash translation layer that is operable to translate a logical address associated with the write request to a corresponding physical address of a location in the non-volatile memory.

4. The memory device of claim 1, wherein the non-volatile memory includes a flash memory.

5. The memory device of claim 1, wherein the second circuit is further configured to:
   detect a count of swaps performed on the page where the data was last stored;
   complete the write request when the count of swaps is less than a threshold; and
   forward the write request to the first circuit when the count of swaps is greater than the threshold.

6. The memory device of claim 1, wherein:
   the controller includes a flag check circuit for detecting a value of a flag; and
   the selection of one of the first circuit and the second circuit is performed based on the value of the flag.

7. A method for storing data in a non-volatile memory device, the non-volatile memory device including a non-volatile memory and a controller, the controller including a first circuit and a second circuit, the method comprising:
   receiving, by the controller, a write request,
   selecting, by the controller, one of the first circuit and the second circuit and completing the write request using the selected one of the first circuit and the second circuit,
   wherein completing the write request with the first circuit includes determining a physical address for a least used page in the non-volatile memory, and causing data associated the write request to be written to the least used page, and
   wherein completing the write request with the second circuit includes determining a physical address for a page in the non-volatile memory where the data associated with the write request was last stored, identifying cells of the data that have changed, and causing only those cells of the data that have changed to be written to the page where the data was last stored, wherein any data that is stored in the non-volatile memory is organized into pages, each page including a plurality of cells, wherein the first circuit includes a wear-leveling circuit and the second circuit includes a wear-limiting circuit.

8. The method of claim 7, further comprising identifying a value of a flag associated with the write request, wherein:
   the first circuit is selected to complete the write request when the flag has a first value; and
   the second circuit is selected to complete the write request when the flag has a second value.

9. The method of claim 7, wherein the second circuit and the first circuit are part of a flash translation layer that is operable to translate a logical address associated with the write request to a corresponding physical address of a location in the non-volatile memory.

10. The method of claim 7, wherein the non-volatile memory includes a flash memory.

11. The method of claim 7, further comprising, detecting a count of swaps performed on the page where the data was last stored, wherein the write request is completed by the second circuit only when the count of swaps is less than a threshold.

12. A non-transitory computer-readable medium having instructions stored thereon, which when executed by at least one controller cause the at least one controller to perform a method, comprising:
   receiving a write request,
   selecting one of a second circuit and a first circuit and completing the write request using the selected one of the first circuit and the second circuit,
   wherein completing the write request with the first circuit includes determining a physical address for at least used page in a non-volatile memory, and causing data associated the write request to be written to the least used page, and
   wherein completing the write request with the second circuit includes determining a physical address for a page in the non-volatile memory where the data associated with the write request was last stored, identifying cells of the data that have changed, and causing only those cells of the data that have changed to be written to the page where the data was last stored, wherein any data that is stored in the non-volatile memory is organized into pages, each page including a plurality of cells, wherein the first circuit includes a wear-leveling circuit and the second circuit includes a wear-limiting circuit.

13. The non-transitory computer-readable medium of claim 12, wherein the method further comprises identifying a value of a flag associated with the write request, wherein:
   the first circuit is selected to complete the write request when the flag has a first value; and
   the second circuit is selected to complete the write request when the flag has a second value.

14. The non-transitory computer-readable medium of claim 12, wherein the non-volatile memory includes a flash memory.

15. The non-transitory computer-readable medium of claim 12, wherein the method further comprises detecting a count of swaps performed on the page where the data was last stored, wherein the write request is completed by the second circuit only when the count of swaps is less than a threshold.

* * * * *